(12) United States Patent
Hayakawa et al.

(10) Patent No.: US 8,106,307 B2
(45) Date of Patent: Jan. 31, 2012

(54) SUBSTRATE STRUCTURE AND ELECTRONIC APPARATUS

(75) Inventors: Haruo Hayakawa, Kanagawa (JP); Kazuhiro Konishi, Kanagawa (JP); Mamoru Yoshida, Kanagawa (JP); Kazunori Kouno, Kanagawa (JP)

(73) Assignee: Panasonic Corporation, Osaka (JP)

( * ) Notice: Subject to any disclaimer, the term of this patent is extended or adjusted under 35 U.S.C. 154(b) by 609 days.

(21) Appl. No.: 12/162,211

(22) PCT Filed: Jan. 26, 2007

(86) PCT No.: PCT/JP2007/051307
§ 371 (c)(1),
(2), (4) Date: Jul. 25, 2008

(87) PCT Pub. No.: WO2007/086525
PCT Pub. Date: Aug. 2, 2007

(65) Prior Publication Data
US 2009/0032298 A1    Feb. 5, 2009

(30) Foreign Application Priority Data
Jan. 26, 2006  (JP) ................ 2006-017844

(51) Int. Cl.
*H05K 1/16* (2006.01)
*H05K 1/14* (2006.01)

(52) U.S. Cl. ........ 174/260; 361/749; 361/760; 361/761; 174/254; 349/150

(58) Field of Classification Search ............... 174/254, 174/260–262, 521; 361/749, 760–761; 345/905; 349/149–150
See application file for complete search history.

(56) References Cited

U.S. PATENT DOCUMENTS

| 7,088,590 | B2 | 8/2006 | Rumsey |
| 7,355,547 | B2 * | 4/2008 | Nakazawa et al. ............ 342/70 |
| 7,417,873 | B2 | 8/2008 | Kadoya |
| 2002/0129971 | A1 | 9/2002 | Kolb |
| 2003/0231275 | A1 | 12/2003 | Shirato et al. |

(Continued)

FOREIGN PATENT DOCUMENTS
EP    1677583 A1    7/2006
(Continued)

OTHER PUBLICATIONS
International Search Report (ISR) for PCT/JP2007/051307, Apr. 20, 2007.
(Continued)

*Primary Examiner* — Robert J Hoffberg
(74) *Attorney, Agent, or Firm* — Seed IP Law Group PLLC

(57) ABSTRACT

A substrate structure capable of miniaturizing and thinning a housing of a portable terminal is provided.

A substrate structure 10 comprises a substrate 11, plural electronic components 12 mounted along one mounting surface 11A in the substrate 11, and a resin part 13 for making close contact with the mounting surface 11A of the substrate 11 while each of the electronic components 12 is covered with a resin 13A. In the substrate structure 10, a through hole 14 extending through the substrate 11 in a thickness direction is disposed and also the side of the mounting surface 11A in the through hole 14 is closed by a lid member 15. A rising part 21 is disposed in a peripheral part of this lid member 15.

6 Claims, 7 Drawing Sheets

U.S. PATENT DOCUMENTS

| | | |
|---|---|---|
| 2004/0105291 A1 | 6/2004 | Rumsey |
| 2005/0088830 A1 | 4/2005 | Yumoto et al. |
| 2006/0171127 A1 | 8/2006 | Kadoya |
| 2011/0051382 A1 | 3/2011 | Yumoto et al. |

FOREIGN PATENT DOCUMENTS

| | | |
|---|---|---|
| JP | 49-105866 | 9/1974 |
| JP | 03211756 A | 9/1991 |
| JP | 05090448 A | 4/1993 |
| JP | 06-196877 | 7/1994 |
| JP | 08008509 A | 1/1996 |
| JP | 2511733 Y2 | 7/1996 |
| JP | 08-236876 | 9/1996 |
| JP | 2000150325 A | 5/2000 |
| JP | 3127699 B2 | 11/2000 |
| JP | 2001267710 A | 9/2001 |
| JP | 3241699 | 10/2001 |
| JP | 200420703 A | 1/2004 |
| JP | 2004039723 A | 2/2004 |
| JP | 2005115337 A | 4/2005 |

OTHER PUBLICATIONS

Supplementary European Search Report mailed Jul. 15, 2009 in corresponding European Application No. EP 07 70 7539, filed Jan. 26, 2007.

* cited by examiner

SUBSTRATE STRUCTURE AND ELECTRONIC APPARATUS

TECHNICAL FIELD

The present invention relates to a substrate structure for mounting an electronic component along a mounting surface of a substrate and covering the electronic component with a resin part and also bringing the resin part into close contact with the mounting surface, and an electronic apparatus.

BACKGROUND ART

In recent years, miniaturization, thinning and a decrease in the number of components have been desired in a housing of a portable terminal. In order to satisfy such desires, a substrate structure using a thinned flexible substrate as a circuit substrate received in the housing has been adopted.

In this substrate structure, as shown in FIG. 4, (plural) electronic components 101 mounted on a substrate 100 are collectively covered with a resin part 102 and thereby, strength of mounting of each of the electronic components 101 to the substrate 100 is ensured and also a reinforcing material for maintaining the substrate 100 in a flat plate shape is formed.

Then, a display device 103 such as an LCD disposed in the portable terminal is supported by a support member (not shown) disposed in the substrate 100 so as to stride over the resin part 101 and thereby, the display device 103 is arranged at a position corresponding to an opening disposed in the housing.

In addition, a reinforced structure of an IC package in which the IC package mounted in a motherboard is covered with a reinforcing frame comprising a side surface part and an upper surface part and the inside of the reinforcing frame is filled with a resin has been proposed (for example, see Patent Reference 1).

According to this Patent Reference 1, the resin part 102 shown in FIG. 4 is constructed of a reinforcing frame 102A and a resin 102B.

Patent Reference 1: Japanese Patent No.3241669

DISCLOSURE OF THE INVENTION

Problems That The Invention Is To Solve

By the way, in the substrate structure described above, soft wiring 105 led from an end face 103A of the display device 103 is cabled on the side of a back surface 100A of the substrate 100 so as to laminate the end 105A to the lamination side.

However, when an electronic component 106 is mounted on the soft wiring 105 of the display device 103, a thickness dimension of the whole substrate structure increases by the amount of a height dimension H of the electronic component 106 and it becomes an obstacle to thinning and miniaturization of the portable terminal.

The invention has been implemented in order to solve the disadvantage described above, and an object of the invention is to provide a substrate structure capable of miniaturizing and thinning a housing of a portable terminal, and an electronic apparatus.

Means For Solving The Problems

A substrate structure of the invention comprises a substrate having a first surface, a second surface opposite to the first surface, a first region on the first surface, a second region by which the first region is surrounded on the first surface, and a through hole which is present inside the first region and extends through the portion between the first surface and the second surface, a lid member for covering the through hole and is mounted on the first surface at a boundary between the first region and the second region, and a resin part made of a resin which makes close contact with the lid member and makes close contact with the second region of the first surface.

In such a substrate structure of the invention, the through hole extending through the substrate is covered with the lid member, so that space in which an electronic component etc. can be arranged without being influenced by the resin part can be formed inside the through hole.

Also, in the substrate structure of the invention, the resin of the resin part is in close contact with the substrate and the lid member, so that strength of attachment of the lid member to the substrate can be improved.

By the way, as a movable component such as a mechanical switch, a structure in which a movable part protrudes from the back side of a body in synchronization with an operation part when a user presses the operation part disposed in the front side of the body has been known. When such a movable component is received in a housing of an electronic apparatus such as a portable terminal, it is necessary to provide occupation space with the volume or more of the movable component of a state (an initial state) before the operation part is pressed in consideration of the fact that the movable part protrudes from the body inside the housing.

However, in the electronic apparatus in which miniaturization and thinning have been desired in recent years, providing the space with the volume or more of the movable component inside the housing becomes an obstacle to miniaturization and thinning of the housing.

On the other hand, in the substrate structure of the invention described above, space corresponding to the through hole is newly formed by a structure of covering the through hole with the lid member, so that it is unnecessary to separately provide space for receiving the movable part etc. of the movable component described above and thereby, the problem described above is solved.

Also, a substrate structure of the invention comprises a substrate having a first surface, a second surface opposite to the first surface, a first region on the first surface, a second region by which the first region is surrounded on the first surface, and a through hole which is present inside the first region and extends through the portion between the first surface and the second surface, a lid member for covering the through hole and is mounted on the first surface at a boundary between the first region and the second region, a resin part made of a resin which makes close contact with the lid member and makes close contact with the second region of the first surface, and a first electronic component which is mounted in the second region of the first surface and is covered with the resin part.

In such a substrate structure of the invention, the lid member is covered with the resin part, so that strength of attachment of the lid member to the substrate can be improved, and the electronic component is covered with the resin part, so that strength of mounting of the electronic component to the substrate can be improved.

Then, in the substrate structure of the invention, the substrate, the lid member and the electronic component collectively make close contact with the resin part, so that rigidity including torsional strength, bending strength, etc. as the substrate improves by a synergistic effect of an improvement in the attachment strength of the lid member and an improvement in the mounting strength of the electronic component.

Further, a substrate structure of the invention comprises a substrate having a first surface, a second surface opposite to the first surface, a first region on the first surface, a second region by which the first region is surrounded on the first surface, and a through hole which is present inside the first region and extends through the portion between the first surface and the second surface, a lid member for covering the through hole and is mounted on the first surface at a boundary between the first region and the second region, a resin part made of a resin which makes close contact with the lid member and makes close contact with the second region of the first surface, and a second electronic component mounted in the first region of the first surface.

In such a substrate structure of the invention, the second electronic component is mounted inside space formed in the first region of the first surface of the substrate by the lid member.

That is, in the substrate structure of the invention, the second electronic component which does not want to be touched to the resin whose permeability or permittivity is different from that of air can be mounted on the first surface of the substrate.

Then, in the substrate structure of the invention, air of the inside of the space formed by the lid member communicates to the outside through the through hole, so that a temperature of the inside of the space formed by the lid member can be maintained at a temperature equal to an outside temperature and thereby, overheating of the second electronic component can be prevented. Also, when a temperature of the substrate structure of the invention rises, air of the inside of the space formed by the lid member expands, but the expanding air communicates to the outside through the through hole, so that an atmospheric pressure of the inside of the space can be adjusted to an atmospheric pressure of the outside of the substrate structure.

Also, a substrate structure of the invention comprises a substrate having a first surface, a second surface opposite to the first surface, a first region on the first surface, a second region by which the first region is surrounded on the first surface, and a through hole which is present inside the first region and extends through the portion between the first surface and the second surface, a lid member for covering the through hole and is mounted on the first surface at a boundary between the first region and the second region, a resin part made of a resin which makes close contact with the lid member and makes close contact with the second region of the first surface, and a third electronic component arranged inside the through hole.

Here, it is optional whether or not the third electronic component is in contact with the lid member or an inner surface of the through hole, or whether or not the third electronic component protrudes from the through hole.

In such a substrate structure of the invention, the through hole extending through the substrate is covered with the lid member, so that space in which the third electronic component etc. can be arranged without being influenced by the resin part can be formed inside the through hole.

Also, in the substrate structure of the invention, the resin of the resin part is in close contact with the substrate and the lid member, so that strength of attachment of the lid member to the substrate can be improved.

Further, a substrate structure of the invention comprises a first substrate having a first surface, a second surface opposite to the first surface, a first region on the first surface, a second region by which the first region is surrounded on the first surface, and a through hole which is present inside the first region and extends through the portion between the first surface and the second surface, a lid member for covering the through hole and is mounted on the first surface at a boundary between the first region and the second region, a resin part made of a resin which makes close contact with the lid member and makes close contact with the second region of the first surface, a second substrate bonded to the second surface of the first substrate, and a fourth electronic component which is mounted on the second substrate and is arranged inside the through hole.

In such a substrate structure of the invention, the fourth electronic component is mounted in the second substrate separate from the first substrate, so that when plural kinds of fourth electronic components with different kinds or functions are previously prepared as modules mounted in the second substrate and these modules are properly selected and the second substrate is bonded to the first substrate, flexibility in design increases (for example, design can easily be changed) and also an evaluation in a module single body can easily be made.

Also, connection between the fourth electronic component and the first substrate is made by the fourth substrate bonded to the second surface of the first substrate, and the connection between the fourth electronic component and the first substrate can be made at a short distance.

Also, a substrate structure of the invention comprises a third substrate having a first surface, a second surface opposite to the first surface, a first region on the first surface, a second region by which the first region is surrounded on the first surface, and a through hole which is present inside the first region and extends through the portion between the first surface and the second surface, a lid member for covering the through hole and is mounted on the first surface at a boundary between the first region and the second region, a resin part made of a resin which makes close contact with the lid member and makes close contact with the second region of the first surface, a fourth substrate having a first surface and a second surface opposite to the first surface, and a fifth electronic component mounted on the first surface of the fourth substrate, and is characterized in that the second surface of the fourth substrate is bonded to the first region of the first surface of the third substrate and the fifth electronic component is arranged in the first region.

In such a substrate structure of the invention, the fifth electronic component is mounted inside space formed in the first region of the first surface of the substrate by the lid member, so that the fifth electronic component which does not want to be touched to the resin whose permeability or permittivity is different from that of air can be mounted on the first surface of the substrate.

Then, in such a substrate structure of the invention, the fifth electronic component is mounted in the third substrate separate from the first substrate, so that when plural kinds of fifth electronic components with different kinds or functions are previously prepared as modules mounted in the third substrate and these modules are properly selected and the third substrate is bonded to the first substrate, flexibility in design increases (for example, design can easily be changed) and also an evaluation in a module single body can easily be made.

Further, a substrate structure of the invention comprises a third substrate having a first surface, a second surface opposite to the first surface, a first region on the first surface, a second region by which the first region is surrounded on the first surface, and a through hole which is present inside the first region and extends through the portion between the first surface and the second surface, a lid member for covering the through hole and is mounted on the first surface at a boundary between the first region and the second region, a resin part made of a resin which makes close contact with the lid member and makes close contact with the second region of the first surface, a fourth substrate having a first surface and a second surface opposite to the first surface, a fifth electronic component mounted on the first surface of the fourth substrate, and a sixth electronic component mounted on the second surface of the fourth substrate, and is characterized in that the second surface of the fourth substrate is bonded to the first region of the first surface of the third substrate and the fifth electronic component is arranged in the first region and the sixth electronic component is arranged inside the through hole.

In such a substrate structure of the invention, the fifth electronic component is mounted inside space formed in the first region of the first surface of the substrate by the lid member, so that the fifth electronic component which does not want to be touched to the resin whose permeability or permittivity is different from that of air can be mounted on the first surface of the substrate.

Also, in the substrate structure of the invention, the fifth electronic component is mounted on the first surface of the fourth substrate and the sixth electronic component is mounted on the second surface of the fourth substrate, so that a mounting density per unit surface area in the fourth substrate increases.

Then, in such a substrate structure of the invention, the fifth electronic component and the sixth electronic component are mounted in the fourth substrate separate from the first substrate, so that when plural kinds of fifth electronic components and sixth electronic components with different kinds or functions are previously prepared as modules mounted in the fourth substrate and these modules are properly selected and the fourth substrate is bonded to the first substrate, flexibility in design increases (for example, design can easily be changed) and also an evaluation in a module single body can easily be made.

Then, the substrate structure of the invention is characterized in that a rising part is disposed in a peripheral part of the lid member.

In such a substrate structure of the invention, the rising part is disposed in the peripheral part of the lid member, so that a top part of the lid member can be separated from the through hole by the amount of the rising part.

That is, in the substrate structure of the invention, space continuous with the through hole can be formed by the lid member, so that even when the electronic component is larger than a thickness of the substrate, a rising dimension of the rising part is properly selected and also a part of the electronic component is received inside the space formed by the lid member and thereby, the electronic component can be arranged so as not to protrude from the second surface of the substrate without touching the resin part.

Also, an electronic apparatus of the invention has the substrate structure described above.

Effect Of The Invention

According to the invention, it has an effect capable of miniaturizing and thinning a circuit substrate or an electronic apparatus using the circuit substrate by receiving an electronic component in a through hole.

Further, according to the invention, it has an effect capable of preventing the electronic component from touching a resin part by covering the through hole with a lid member.

DESCRIPTION OF REFERENCE NUMERALS AND SIGNS

10,30,40,50,60,70 SUBSTRATE STRUCTURE
10A,30A,40A,50A,60A,70A FIRST REGION
10B,30B,40B,50B,60B,70B SECOND REGION
11,71 SUBSTRATE
11A FIRST SURFACE
11B SECOND SURFACE
12,16,32,43,66,72,73 ELECTRONIC COMPONENT
13 RESIN PART
13A RESIN
14,41 THROUGH HOLE
15,31 LID MEMBER
19 SOFT WIRING (SUBSTRATE)
21 RISING PART
72 FIRST SURFACE OF FOURTH SUBSTRATE
73 SECOND SURFACE OF FOURTH SUBSTRATE

BEST MODE FOR CARRYING OUT THE INVENTION

First Embodiment

Figure 1:
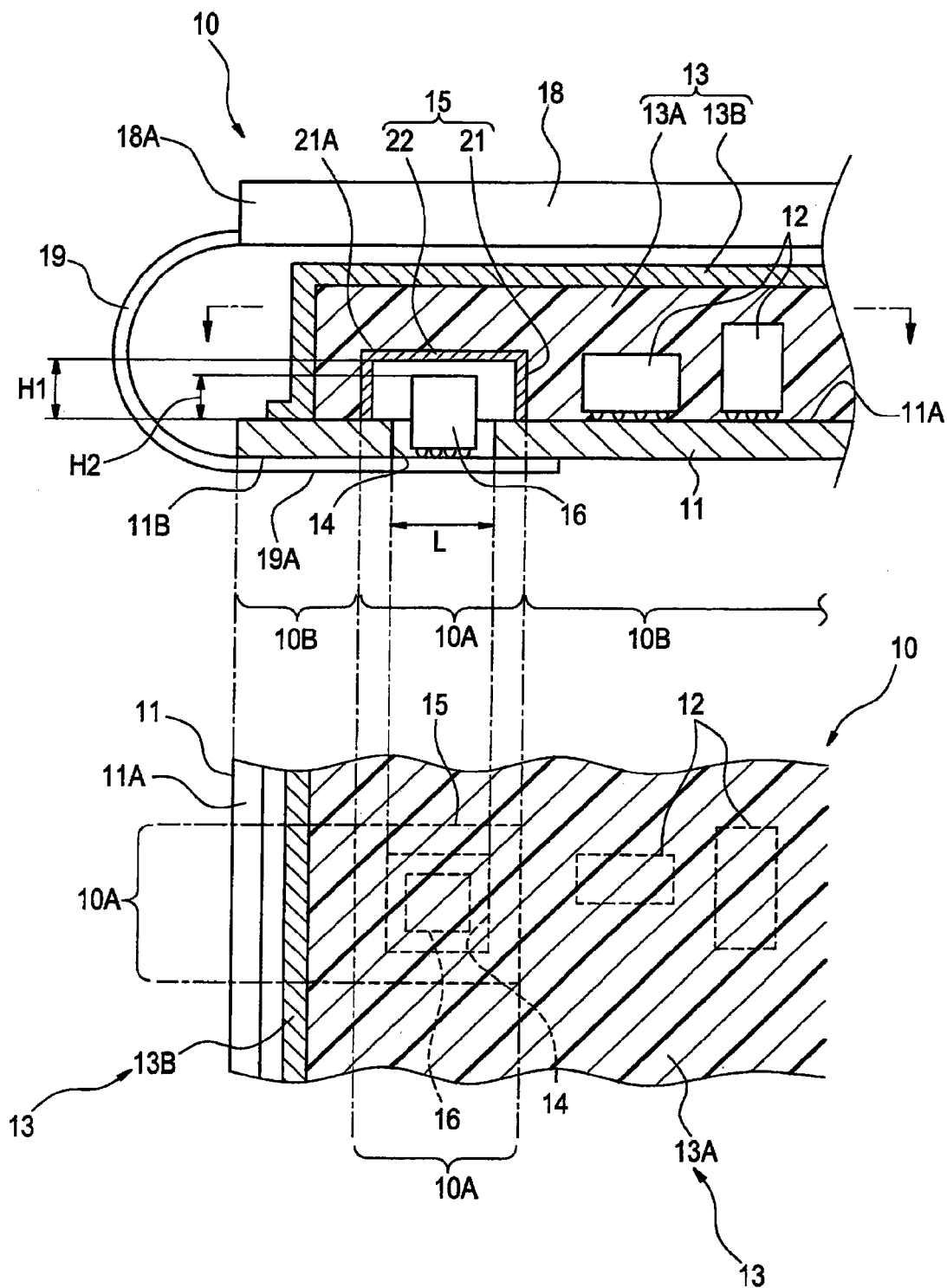
FIG. 1 is a sectional view and a plan view showing a substrate structure (first embodiment) according to the invention.

As shown in FIG. 1, a substrate structure 10 of a first embodiment comprises a substrate 11, plural electronic components 12 mounted along one mounting surface 11A on the substrate 11, and a resin part 13 for making close contact with the mounting surface 11A of the substrate 11 while each of the electronic components 12 is covered with a resin 13A, and is received in a housing of an electronic apparatus such as a portable terminal.

In this substrate structure 10, a through hole 14 is disposed in the substrate 11 and also the side of the mounting surface 11A in the through hole 14 is closed by a lid member 15 and an electronic component 16 is received in the through hole 14.

In this substrate 11, a support member (not shown) is disposed so as to stride over the resin part 13, and a display device 18 such as an LCD is supported in this support member. Soft wiring 19 is led from an end face 18A of the display device 18, and the end 19A of the soft wiring 19 is cabled so as to be laminated on the side of a back surface 11B (that is, a surface opposite to the mounting surface 11A) of the substrate 11.

The through hole 14 is covered with the end 19A of the soft wiring 19, and the electronic component 16 is mounted in the end 19A.

The resin part 13 is means in which the electronic components 12 and the lid member 15 are covered with a reinforcing frame (frame body) 13B and the inside of the reinforcing frame 13B is filled with a resin 13A.

The electronic components 12 mounted on the substrate 11 are collectively covered with the resin part 13 and thereby, strength of mounting of the electronic components 12 to the substrate 11 is ensured and also the substrate 11 is maintained in a flat plate shape.

The through hole 14 is disposed in a thickness direction of the substrate 11 and also is formed in a size dimension L capable of receiving the electronic component 16.

In the lid member 15, a rising part 21 with a height dimension H1 is disposed in a peripheral part and a top part 22 is disposed in the upper edge 21A of the rising part 21 and thereby, the lid member 15 is formed in substantially a cross-sectional U shape.

As a material of the lid member 15, a metal, a resin, an inorganic substance, etc. are used. Further, a mesh can also be used as the lid member 15 unless the resin 13A exudes to the side of the electronic component 16 in consideration of pressure and viscosity at the time of melt in the case of melting the resin 13A of the resin part 13 and supplying the resin 13A to the inside of the reinforcing frame 13B.

Here, it is preferable to use a metal when electrical shielding is required in the lid member 15. In addition, when the electrical shielding refers to "high-frequency electrical shielding", the mesh can also be used. In this case, the mesh can be used when a size of the mesh (net) corresponds to the maximum length based on a high frequency.

By disposing the rising part 21 with the height dimension H1 in the lid member 15, the top part 22 of the lid member 15 can be separated from the side of the mounting surface 11A of the through hole 14 by the amount of the height dimension H1 of the rising part 21.

Hence, the electronic component 16 can be covered with the lid member 15 even when the electronic component 16 received in the through hole 14 protrudes from the through hole 14 to the side of the mounting surface 11A by the amount of a protrusion dimension H2. This is because the protrusion dimension H2 is a dimension smaller than the height dimension H1.

Consequently, the large-sized electronic component 16 can be received in the through hole 14 without being touched to the resin part 13.

Besides, by receiving the electronic component 16 in the through hole 14, the electronic component 16 is prevented from protruding from the substrate 11 and the housing of the portable terminal can be miniaturized and thinned.

In other words, in the substrate structure 10 as described above, the substrate 11 which is a first substrate has the first surface 11A, a second surface 11B opposite to the first surface 11A, a first region 10A on the first surface 11A, a second region 10B by which the first region 10A is surrounded on the first surface 11A, and the through hole 14 which is present inside the first region 10A and extends through the portion between the first surface 11A and the second surface 11B.

Also, in the substrate structure 10, the lid member 15 covers the through hole 14 and is mounted on the first surface 11A at a boundary between the first region 10A and the second region 10B.

Further, in the substrate structure 10, the resin part 13 is made of the resin 13A which makes close contact with the lid member 15 and makes close contact with the second region 10B of the first surface 11A.

Then, in the substrate structure 10, the electronic components 12 which are first electronic components are mounted in the second region 10B of the first surface 11A.

Also, in the substrate structure 10, the soft wiring 19 which is a second substrate is bonded to the second surface 11B of the substrate 14 which is a first substrate.

Further, in the substrate structure 10, the electronic component 16 which is a fourth electronic component is mounted on the soft wiring 19 which is the second substrate, and is arranged inside the through hole 14.

Therefore, according to the substrate structure 10, the through hole 14 extending through the substrate 11 which is the first substrate is covered with the lid member 15, so that space in which the electronic component 16 etc. which is the fourth electronic component can be arranged without being influenced by the resin part 13 can be formed inside the through hole 14.

Also, according to the substrate structure 10, the resin 13A of the resin part 13 is in close contact with the lid member 15, so that strength of attachment of the lid member 15 to the substrate 11 which is the first substrate can be improved.

Further, according to the substrate structure 10, the electronic components 12 which are the first electronic components are covered with the resin part 13, so that strength of mounting of the electronic components 12 to the substrate 11 which is the first substrate can be improved.

Moreover, according to the substrate structure 10, the lid member 15 and the electronic components 12 which are the first electronic components are collectively covered with the resin part 13, so that rigidity including torsional strength, bending strength, etc. as the substrate 11 which is the first substrate improves by a synergistic effect of an improvement in the attachment strength of the lid member 15 and an improvement in the mounting strength of the electronic components 12.

Also, according to the substrate structure 10, the electronic component 16 which is the fourth electronic component is mounted in the soft wiring 19 which is the second substrate separate from the substrate 11 which is the first substrate, so that when plural kinds of electronic components 16 with different kinds or functions are previously prepared as modules mounted in the soft wiring 19 which is the second substrate and these modules are properly selected and the soft wiring 19 (second substrate) is bonded to the substrate 11 (first substrate), flexibility in design increases (for example, design can easily be changed) and also an evaluation in a module single body can easily be made.

Next, substrate structures of a second embodiment to a sixth embodiment will be described based on FIGS. 2 to 3 and FIGS. 5 to 7. In addition, description is omitted by assigning the same numerals to the same and similar members as those of the substrate structure 10 of the first embodiment in the substrate structures of the second embodiment to the sixth embodiment.

Second Embodiment

Figure 2:
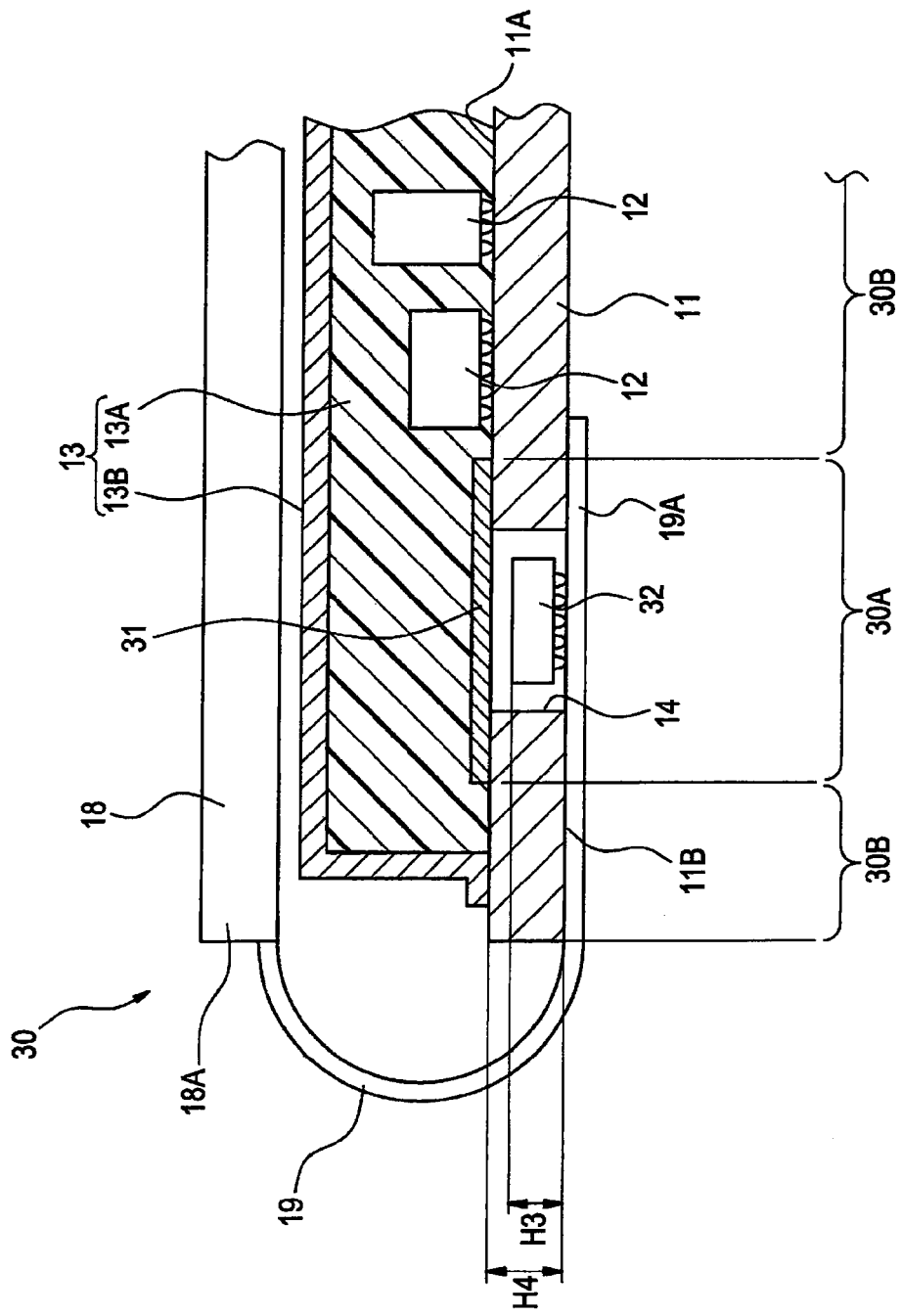
FIG. 2 is a sectional view showing a substrate structure (second embodiment) according to the invention.

As shown in FIG. 2, a substrate structure 30 of a second embodiment is a structure using a lid member 31 instead of the lid member 15 of the first embodiment, and the other configuration is similar to that of the first embodiment.

The lid member 31 is a flat plate material for closing the side of a mounting surface 11A in a through hole 14.

An electronic component 32 is received in the through hole 14, and the electronic component 32 is mounted on the end 19A of soft wiring 19.

A height dimension H3 of the electronic component 32 is smaller than a depth dimension H4 of the through hole 14. Consequently, the electronic component 32 can be received in the through hole 14 without being touched to a resin part 13.

As the lid member 31, the same material as that of the lid member 15 is used.

According to the substrate structure 30 of the second embodiment, an effect similar to that of the substrate structure 10 of the first embodiment can be obtained.

In other words, in the substrate structure 30 as described above, a substrate 11 which is a first substrate has the first surface 11A, a second surface 11B opposite to the first surface 11A, a first region 30A on the first surface 11A, a second region 30B by which the first region 30A is surrounded on the first surface 11A, and the through hole 14 which is present inside the first region 30A and extends through the portion between the first surface 11A and the second surface 11B.

Also, in the substrate structure 30, the lid member 31 covers the through hole 14 and is mounted on the first surface 11A at a boundary between the first region 30A and the second region 30B.

Further, in the substrate structure 30, the resin part 13 is made of a resin 13A which makes close contact with the lid member 31 and makes close contact with the second region 30B of the first surface 11A.

Then, in the substrate structure 30, electronic components 12 which are first electronic components are mounted in the second region 30B of the first surface 11A.

Also, in the substrate structure 30, the soft wiring 19 which is a second substrate is bonded to the second surface 11B of the substrate 14 which is a first substrate.

Further, in the substrate structure 30, the electronic component 32 which is a fourth electronic component is mounted on the soft wiring 19 which is the second substrate, and is arranged inside the through hole 14.

Therefore, according to the substrate structure 30, the through hole 14 extending through the substrate 11 which is the first substrate is covered with the lid member 31, so that space in which the electronic component 32 etc. which is the fourth electronic component can be arranged without being influenced by the resin part 13 can be formed inside the through hole 14.

Also, according to the substrate structure 30, the resin 13A of the resin part 13 is in close contact with the lid member 31, so that strength of attachment of the lid member 31 to the substrate 11 which is the first substrate can be improved.

Further, according to the substrate structure 30, the electronic components 12 which are the first electronic components are covered with the resin part 13, so that strength of mounting of the electronic components 12 to the substrate 11 which is the first substrate can be improved.

Moreover, according to the substrate structure 30, the lid member 31 and the electronic components 12 which are the first electronic components are collectively covered with the resin part 13, so that rigidity including torsional strength, bending strength, etc. as the substrate 11 which is the first substrate improves by a synergistic effect of an improvement in the attachment strength of the lid member 31 and an improvement in the mounting strength of the electronic components 12.

Also, according to the substrate structure 30, the electronic component 32 which is the fourth electronic component is mounted on the soft wiring 19 which is the second substrate separate from the substrate 11 which is the first substrate, so that when plural kinds of electronic components 32 with different kinds or functions are previously prepared as modules mounted on the soft wiring 19 which is the second substrate and these modules are properly selected and the soft wiring 19 (second substrate) is bonded to the substrate 11 (first substrate), flexibility in design increases (for example, design can easily be changed) and also an evaluation in a module single body can easily be made.

Third Embodiment

Figure 3:
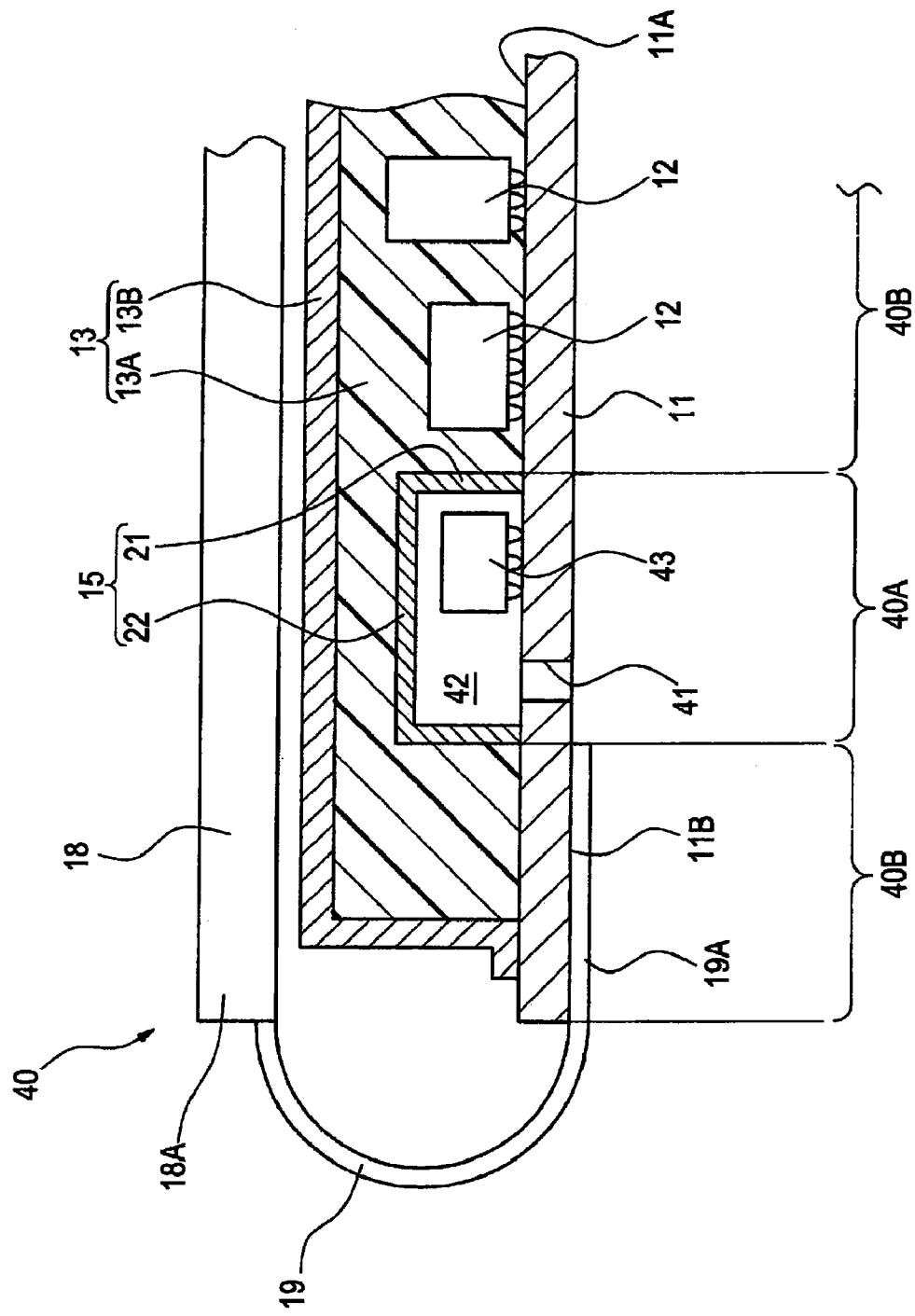
FIG. 3 is a sectional view showing a substrate structure (third embodiment) according to the invention.
Figure 4:
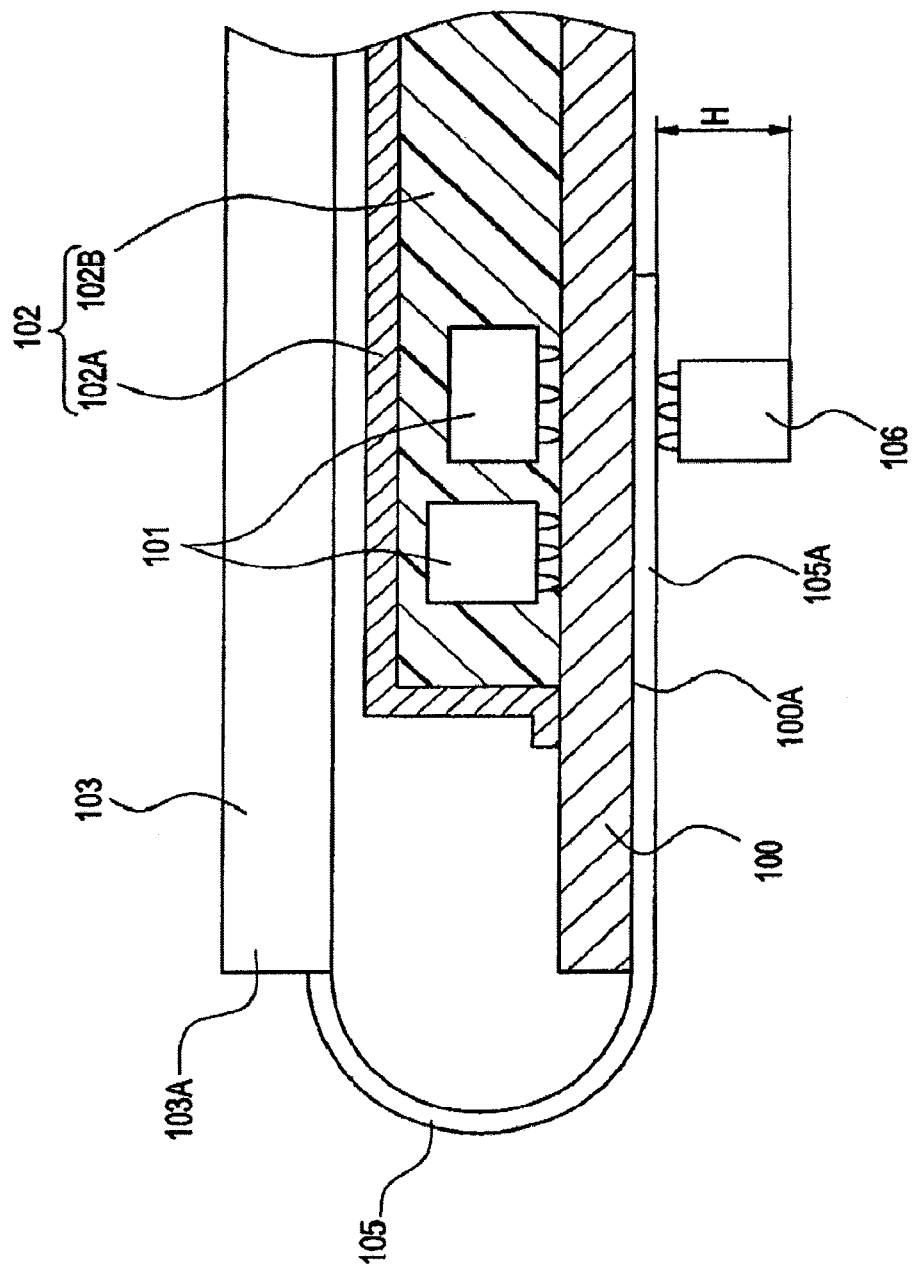
FIG. 4 is a sectional view showing a conventional substrate structure.

As shown in FIG. 3, a substrate structure 40 of a third embodiment is a structure in which a through hole 41 is disposed instead of the through hole 14 of the first embodiment and the end 19A of soft wiring 19 is cabled in a state of being avoided from the through hole 41, and the other configuration is similar to that of the first embodiment.

The through hole 41 is disposed in a thickness direction of a substrate 11 and also is closed by a lid member 15 from the side of a mounting surface 11A. By this through hole 41, internal space 42 of the lid member 15 is communicated to the outside.

An electronic component 43 is mounted on the mounting surface 11A of the substrate 11 and also the electronic component 43 is covered with the lid member 15.

According to the substrate structure 40 of the third embodiment, the electronic component 43 can be prevented from touching a resin part 13 by mounting the electronic component 43 on the mounting surface 11A of the substrate 11 and also covering the electronic component 43 with the lid member 15.

Further, by communicating the internal space 42 of the lid member 15 to the outside by the through hole 41, heat of the internal space 42 can be lost to the outside through the through hole 41.

Besides, by mounting the electronic component 43 on the mounting surface 11A of the substrate 11, the electronic component 43 is prevented from protruding from a back surface 11B of the substrate 11 and a housing of a portable terminal can be miniaturized and thinned.

In other words, in the substrate structure 40 as described above, the substrate 11 has the first surface 11A, a second surface 11B opposite to the first surface 11A, a first region 40A on the first surface 11A, a second region 40B by which the first region 40A is surrounded on the first surface 11A, and the through hole 41 which is present inside the first region 40A and extends through the portion between the first surface 11A and the second surface 11B.

Also, in the substrate structure 10, the lid member 15 covers the through hole 41 and is mounted on the first surface 11A at a boundary between the first region 40A and the second region 40B.

Further, in the substrate structure 40, the resin part 13 is made of a resin 13A which makes close contact with the lid member 15 and makes close contact with the second region 40B of the first surface 11A.

Then, in the substrate structure 40, electronic components 12 which are first electronic components are mounted in the second region 40B of the first surface 11A.

In the substrate structure 40, the electronic component 43 which is a second electronic component is mounted in the first region 40A of the first surface 11A.

Therefore, according to the substrate structure 40, the through hole 14 extending through the substrate 11 is covered with the lid member 15, so that the internal space 42 in which the electronic component 43 etc. which is the second electronic component can be arranged without being influenced by the resin part 13 can be formed.

Also, according to the substrate structure 40, the resin 13A of the resin part 13 is in close contact with the lid member 15, so that strength of attachment of the lid member 15 to the substrate 11 can be improved.

Further, according to the substrate structure 40, the electronic components 12 which are the first electronic components are covered with the resin part 13, so that strength of mounting of the electronic components 12 to the substrate 11 can be improved.

Moreover, according to the substrate structure 40, the lid member 15 and the electronic components 12 which are the first electronic components are collectively covered with the resin part 13, so that rigidity including torsional strength, bending strength, etc. as the substrate 11 improves by a synergistic effect of an improvement in the attachment strength of the lid member 15 and an improvement in the mounting strength of the electronic components 12.

Also, according to the substrate structure 40, the electronic component 43 which is the second electronic component is mounted inside the internal space 42 formed in the first region 40A of the first surface 11A of the substrate 11 by the lid member 15, so that the electronic component 43 which does not want to be touched to the resin 13A whose permeability or permittivity is different from that of air can be mounted on the first surface 11A of the substrate 11.

Then, according to the substrate structure 40, air of the inside of the internal space 42 formed by the lid member 15 communicates to the outside through the through hole 41, so that a temperature of the inside of the internal space 42 formed by the lid member 15 can be maintained at a temperature equal to an outside temperature and thereby, overheating of the electronic component 43 which is the second electronic component can be prevented.

Fourth Embodiment

Figure 5:
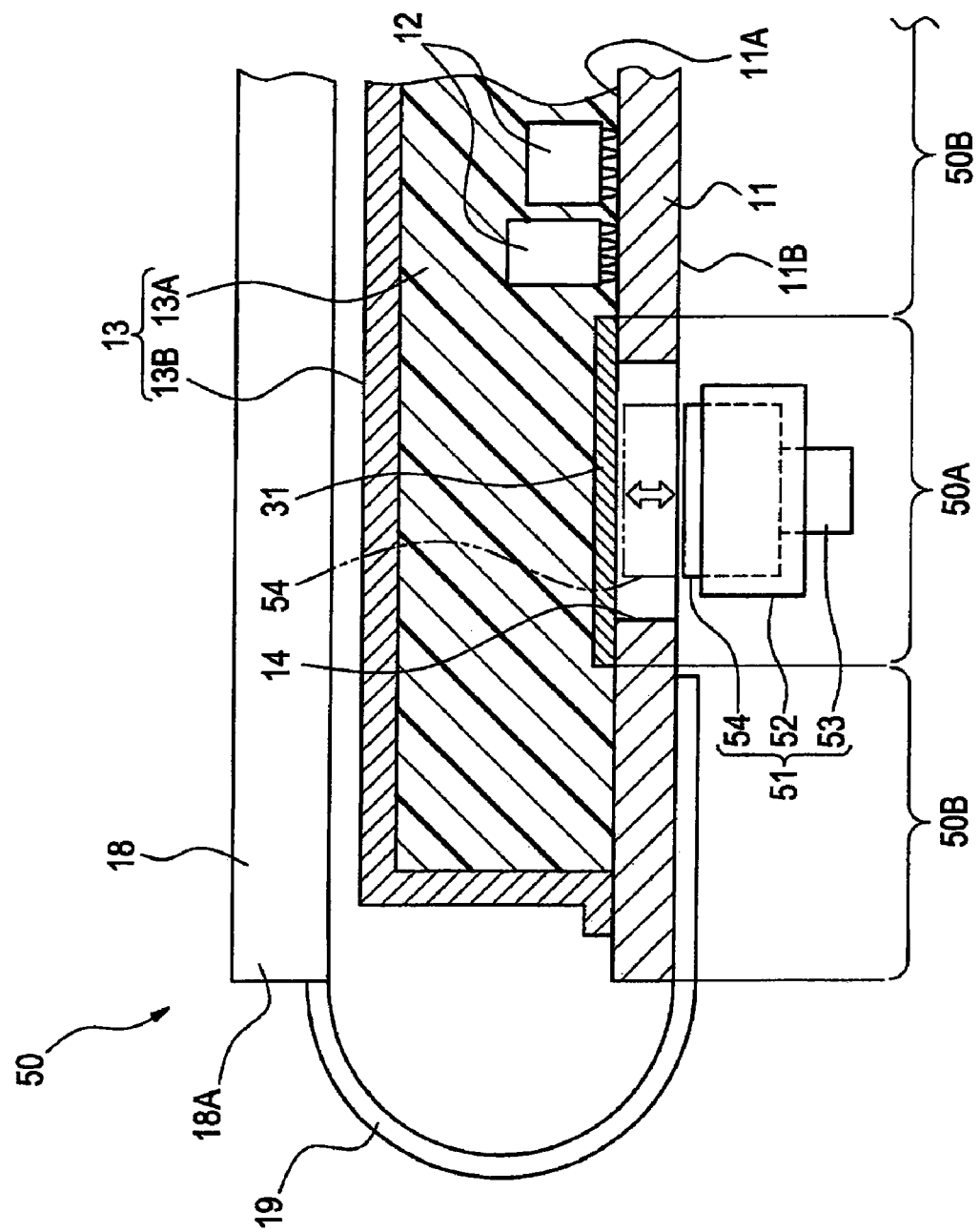
FIG. 5 is a sectional view showing a substrate structure (fourth embodiment) according to the invention.

A substrate structure 50 of a fourth embodiment is shown in FIG. 5.

In the substrate structure 50 of the fourth embodiment, a substrate 11 has a first surface 11A, a second surface 11B opposite to the first surface 11A, a first region 50A on the first surface 11A, a second region 50B by which the first region 50A is surrounded on the first surface 11A, and a through hole 14 which is present inside the first region 50A and extends through the portion between the first surface 11A and the second surface 11B.

Also, in the substrate structure 50, a lid member 31 covers the through hole 14 and is mounted on the first surface 11A at a boundary between the first region 50A and the second region 50B.

Further, in the substrate structure 10, a resin part 13 is made of a resin 13A which makes close contact with the lid member 31 and makes close contact with the second region 10B of the first surface 11A.

Then, in the substrate structure 50, electronic components 12 are mounted in the second region 50B of the first surface 11A.

Therefore, according to the substrate structure 50, the through hole 14 extending through the substrate 11 is covered with the lid member 31, so that predetermined space corresponding to a movable component 51 without being influenced by the resin part 13 can be formed inside the through hole 14.

Here, as the movable component 51 such as a mechanical switch, a structure in which a movable part 54 protrudes from the back side of a body 52 in synchronization with an operation part 53 when a user presses the operation part 53 disposed in the front side of the body 52 has been known.

When such a movable component 51 is received in a housing of an electronic apparatus such as a portable terminal, it is necessary to provide occupation space with the volume or more of the movable component 51 of a state (an initial state: a state of a solid line) before the operation part 53 is pressed in consideration of the fact that the movable part 54 protrudes from the body 52 inside the housing.

However, in the electronic apparatus in which miniaturization and thinning have been desired in recent years, providing the space with the volume or more of the movable component 51 inside the housing becomes an obstacle to miniaturization and thinning of the housing.

On the other hand, according to the substrate structure 50 of the fourth embodiment, space corresponding to the through hole 14 is newly formed by a structure of covering the through hole 14 with the lid member 31, so that it is unnecessary to separately provide space for receiving the movable part 54 of the movable component 51 described above and thereby, an effect capable of miniaturizing and thinning the housing of the electronic apparatus can be obtained.

Also, according to the substrate structure 50, the resin 13A of the resin part 13 is in close contact with the lid member 31, so that strength of attachment of the lid member 31 to the substrate 11 can be improved.

Further, according to the substrate structure 50, the electronic components 12 are covered with the resin part 13, so that strength of mounting of the electronic components 12 to the substrate 11 can be improved.

Moreover, according to the substrate structure 50, the lid member 31 and the electronic components 12 are collectively covered with the resin part 13, so that rigidity including torsional strength, bending strength, etc. as the substrate 11 improves by a synergistic effect of an improvement in the attachment strength of the lid member 31 and an improvement in the mounting strength of the electronic components 12.

Fifth Embodiment

Figure 6:
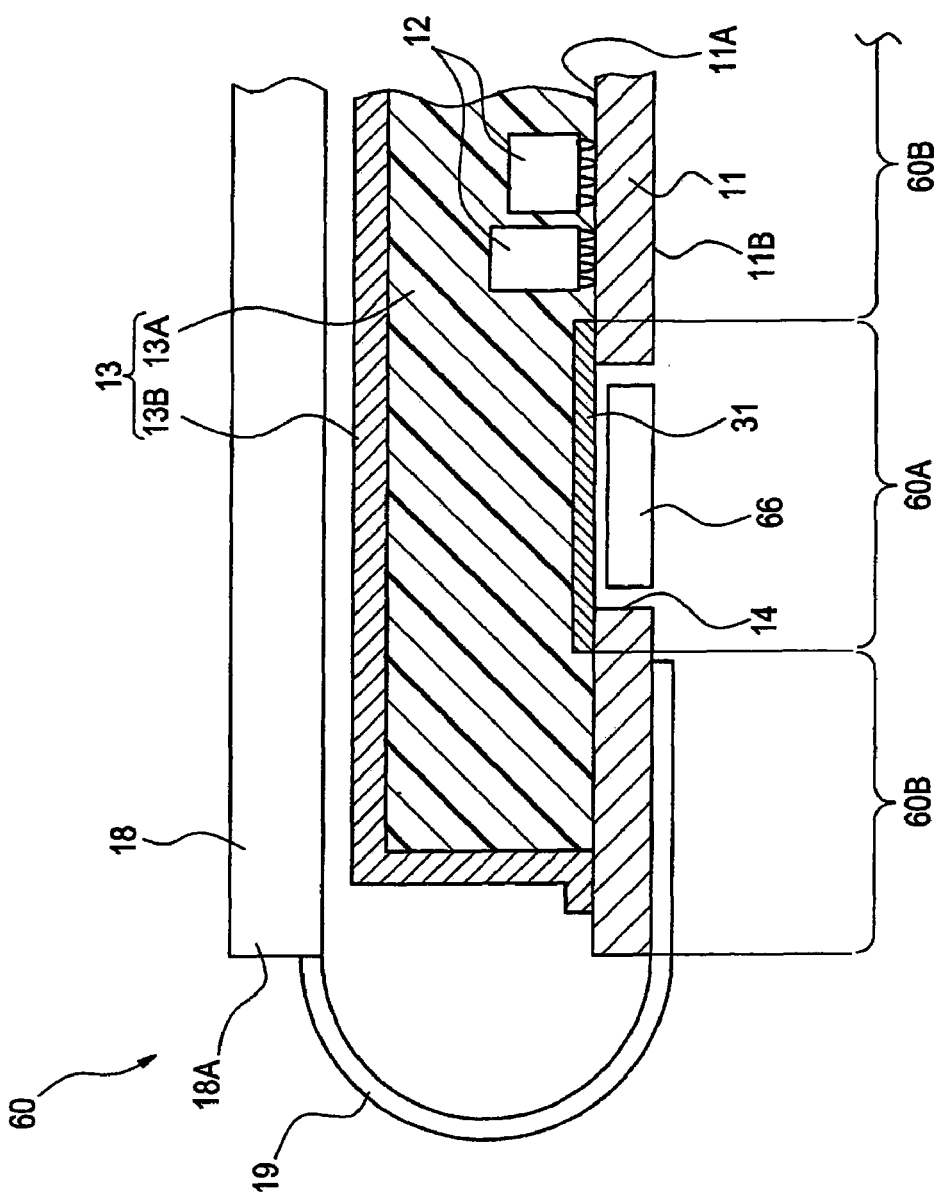
FIG. 6 is a sectional view showing a substrate structure (fifth embodiment) according to the invention.

A substrate structure 60 of a fifth embodiment is shown in FIG. 6.

In the substrate structure 60 of the fifth embodiment, a substrate 11 has a first surface 11A, a second surface 11B opposite to the first surface 11A, a first region 60A on the first surface 11A, a second region 60B by which the first region 60A is surrounded on the first surface 11A, and a through hole 14 which is present inside the first region 60A and extends through the portion between the first surface 11A and the second surface 11B.

Also, in the substrate structure 60, a lid member 31 covers the through hole 14 and is mounted on the first surface 11A at a boundary between the first region 60A and the second region 60B.

Further, in the substrate structure 60, a resin part 13 is made of a resin 13A which makes close contact with the lid member 31 and makes close contact with the second region 60B of the first surface 11A.

Then, in the substrate structure 60, electronic components 12 which are first electronic components are mounted in the second region 60B of the first surface 11A.

Further, in the substrate structure 60, an electronic component 66 which is a fourth electronic components is arranged inside the through hole 14. The electronic component 66 may make contact with one or both of the inner surfaces of the through hole 14 and the lid member 31 or may not make contact with both of the inner surfaces.

Therefore, according to the substrate structure 60, the through hole 14 extending through the substrate 11 is covered with the lid member 31, so that predetermined space corresponding to the electronic component 66 without being influenced by the resin part 13 can be formed inside the through hole 14.

Also, according to the substrate structure 60, the resin 13A of the resin part 13 is in close contact with the lid member 31, so that strength of attachment of the lid member 31 to the substrate 11 can be improved.

Further, according to the substrate structure 60, the electronic components 12 are covered with the resin part 13, so that strength of mounting of the electronic components 12 to the substrate 11 can be improved.

Moreover, according to the substrate structure 60, the lid member 31 and the electronic components 12 are collectively covered with the resin part 13, so that rigidity including torsional strength, bending strength, etc. as the substrate 11 improves by a synergistic effect of an improvement in the attachment strength of the lid member 31 and an improvement in the mounting strength of the electronic components 12.

Sixth Embodiment

Figure 7:
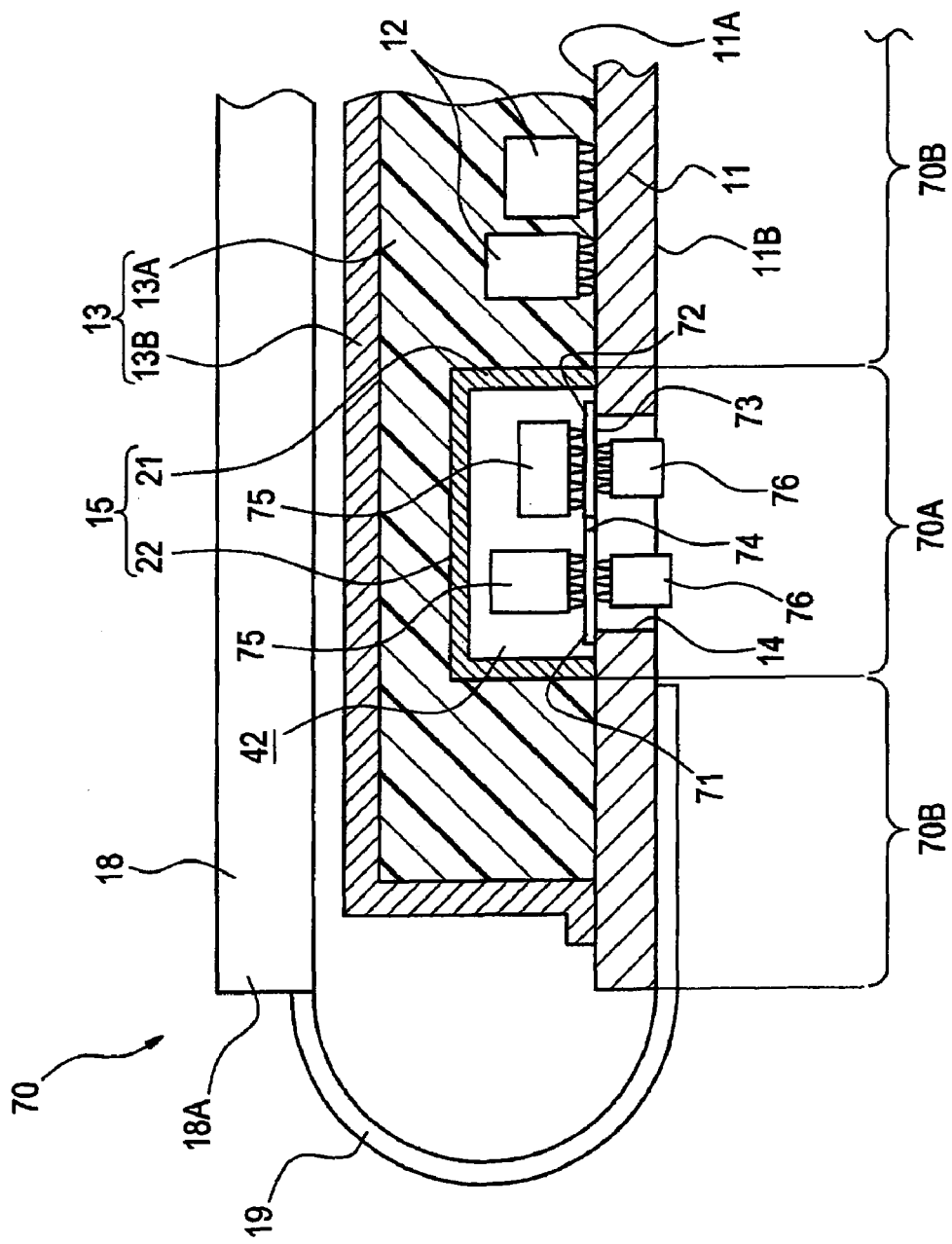
FIG. 7 is a sectional view showing a substrate structure (sixth embodiment) according to the invention.

A substrate structure 70 of a sixth embodiment is shown in FIG. 7.

In the substrate structure 70 of the sixth embodiment, a substrate 11 which is a third substrate has a first surface 11A, a second surface 11B opposite to the first surface 11A, a first region 70A on the first surface 11A, a second region 70B by which the first region 70A is surrounded on the first surface 11A, and a through hole 14 which is present inside the first region 70A and extends through the portion between the first surface 11A and the second surface 11B.

Also, in the substrate structure 70, a lid member 15 covers the through hole 14 and is mounted on the first surface 11A at a boundary between the first region 70A and the second region 70B.

Further, in the substrate structure 70, a resin part 13 is made of a resin 13A which makes close contact with the lid member 31 and makes close contact with the second region 70B of the first surface 11A.

Then, in the substrate structure 70, electronic components 12 which are first electronic components are mounted in the second region 70B of the first surface 11A.

Also, in the substrate structure 70, a substrate 71 which is a fourth substrate has a first surface 72 of the fourth substrate, a second surface 73 of the fourth substrate opposite to the first surface 72 of the fourth substrate, a communication hole 74 extending through the portion between the first surface 72 of the fourth substrate and the second surface 73 of the fourth substrate.

In this substrate 71, electronic components 75 which are fifth electronic components are mounted on the first surface 72 of the fourth substrate, and electronic components 76 which are sixth electronic components are mounted on the second surface 73 of the fourth substrate.

In such a substrate 71, the second surface 73 of the fourth substrate is bonded to the first region 70A of the first surface 11A of the substrate 11 which is the third substrate.

Therefore, the electronic components 75 which are the fifth electronic components are arranged in the first region 70A and the electronic components 76 which are the sixth electronic components are arranged inside the through hole 14.

According to the substrate structure 70 as described above, the through hole 14 extending through the substrate 11 is covered with the lid member 15, so that internal space 42 in which the electronic components 75 etc. which are the fifth electronic components can be arranged without being influenced by the resin part 13 can be formed.

Also, according to the substrate structure 70, the resin 13A of the resin part 13 is in close contact with the lid member 15, so that strength of attachment of the lid member 15 to the substrate 11 can be improved.

Further, according to the substrate structure 70, the electronic components 12 which are the first electronic components are covered with the resin part 13, so that strength of mounting of the electronic components 12 to the substrate 11 can be improved.

Moreover, according to the substrate structure 70, the lid member 15 and the electronic components 12 which are the first electronic components are collectively covered with the resin part 13, so that rigidity including torsional strength, bending strength, etc. as the substrate 11 improves by a synergistic effect of an improvement in the attachment strength of the lid member 15 and an improvement in the mounting strength of the electronic components 12.

Also, according to the substrate structure 70, the electronic components 75 are mounted inside the internal space 42 formed in the first region 70A of the first surface 11A of the substrate 11 by the lid member 15, so that the electronic components 75 which do not want to be touched to the resin whose permeability or permittivity is different from that of air can be mounted on the first surface 11A of the substrate 11.

Then, according to the substrate structure 70, air of the inside of the internal space 42 formed by the lid member 15 communicates to the outside through the communication hole 74 disposed in the substrate 71 which is the fourth substrate, so that a temperature of the inside of the internal space 42 formed by the lid member 15 can be maintained at a temperature equal to an outside temperature and thereby, overheating of the electronic components 45 can be prevented.

Then, according to such a substrate structure 70, the electronic components 75 are mounted on the substrate 71 separate from the substrate 11, so that when plural kinds of electronic components with different kinds or functions are previously prepared as modules mounted on the substrate 71 and these modules are properly selected and the substrate 71 is bonded to the substrate 11, flexibility in design increases (for example, design can easily be changed) and also an evaluation in a module single body can easily be made.

Moreover, according to the substrate structure 70, the electronic components 75 which are the fifth electronic components are mounted on the first surface 72 of the substrate 71 which is the fourth substrate, and the electronic components 76 which are the sixth electronic components are mounted on the second surface 73 of the substrate 71 which is the fourth substrate, so that amounting density per unit surface area in the substrate 71 increases and it is advantageous in the case of miniaturizing and thinning an electronic apparatus.

In addition, the materials, shapes, forms, numbers, positions, etc. of the first surface, the second surface, the first region, the second region, the through hole, the substrates (first to fourth substrates), the lid member, the resin, the resin part, the electronic components (first to sixth electronic components), the rising part, etc. illustrated in each of the embodiments described above are not limited to each of the embodiments, and changes in the scope capable of implementing the invention can be properly made.

The present application is based on Japanese patent application (patent application No. 2006-17844) filed on Jan. 26, 2006, and the contents of the patent application are hereby incorporated by reference.

INDUSTRIAL APPLICABILITY

It is suitable to apply the present invention to a substrate structure for mounting an electronic component along one mounting surface in a substrate and covering the electronic component with a resin part and also bringing the resin part into close contact with the mounting surface, and an electronic apparatus.

The invention claimed is:

1. A substrate structure comprising:
a substrate having a first surface, a second surface opposite to the first surface;
a through hole extends through the substrate from the first surface to the second surface;
a lid member disposed on the first surface for closing the through hole;
a frame body disposed on the first surface for covering the lid member;
a resin part filled between the frame body and the lid member;
a first electronic component disposed within the through hole and inside the lid member, protruding from the through hole to the side of the first surface;
a space provided between the lid member and the first electronic component; and
a second substrate which is connected to the second surface, and on which the first electronic component is mounted.

2. A substrate structure according to claim 1, further comprising:
a second electronic component disposed on the first surface outside of the lid member, wherein the frame body and the resin part cover the second electronic component.

3. A substrate structure as claimed in claim 1, further comprising:
a display device,
wherein the second substrate comprises a soft wiring board connected to the display device.

4. The substrate structure of claim 1, wherein a size of the through hole in a direction of the first surface is equal to a size of the body of the first electronic component in the direction of the first surface allowing an entire section of the body of the first electronic component in the direction of the first surface to be received in the through hole of the substrate.

5. The substrate structure of claim 1, wherein a size of the through hole in a direction of the first surface is greater than a size of the body of the first electronic component in the direction of the first surface allowing an entire section of the body of the first electronic component in the direction of the first surface to be received in the through hole of the substrate.

6. An electronic apparatus including a substrate structure as claimed in claim 1.

* * * * *